(12) United States Patent
Wu

(10) Patent No.: US 11,954,044 B2
(45) Date of Patent: Apr. 9, 2024

(54) TRANSLATION LOOKASIDE BUFFER PREWARMING

(71) Applicant: TEXAS INSTRUMENTS INCORPORATED, Dallas, TX (US)

(72) Inventor: Daniel Brad Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 13 days.

(21) Appl. No.: 17/068,713

(22) Filed: Oct. 12, 2020

(65) Prior Publication Data

US 2021/0109866 A1 Apr. 15, 2021

Related U.S. Application Data

(60) Provisional application No. 62/914,061, filed on Oct. 11, 2019.

(51) Int. Cl.
| | |
|---|---|
| *G06F 12/10* | (2016.01) |
| *G06F 9/46* | (2006.01) |
| *G06F 9/48* | (2006.01) |
| *G06F 12/0862* | (2016.01) |
| *G06F 12/0882* | (2016.01) |
| *G06F 12/0891* | (2016.01) |
| *G06F 12/1009* | (2016.01) |
| *G06F 12/1027* | (2016.01) |
| *H03M 13/15* | (2006.01) |

(52) U.S. Cl.
CPC .......... *G06F 12/1027* (2013.01); *G06F 9/467* (2013.01); *G06F 9/4881* (2013.01); *G06F 12/0862* (2013.01); *G06F 12/0882* (2013.01); *G06F 12/0891* (2013.01); *G06F 12/1009* (2013.01); *H03M 13/1575* (2013.01); *G06F 2212/1021* (2013.01); *G06F 2212/602* (2013.01); *G06F 2212/68* (2013.01)

(58) Field of Classification Search
CPC .......... G06F 12/0862; G06F 2212/602; G06F 12/1027; G06F 12/1009; G06F 12/0891; G06F 2212/1021; G06F 9/467; G06F 9/4881; G06F 12/0882; G06F 2212/68; H03M 13/1575
USPC ......................................................... 711/137
See application file for complete search history.

(56) References Cited

U.S. PATENT DOCUMENTS

| | | | | |
|---|---|---|---|---|
| 8,438,572 | B2 * | 5/2013 | Fecioru | G06F 9/46 718/103 |
| 2013/0305250 | A1 * | 11/2013 | Durant | G06F 9/4881 718/102 |
| 2017/0090999 | A1 * | 3/2017 | Weber | G06F 9/528 |
| 2020/0042348 | A1 * | 2/2020 | Acharya | G06F 9/54 |

* cited by examiner

*Primary Examiner* — Hua J Song
(74) *Attorney, Agent, or Firm* — Brian D. Graham; Frank D. Cimino

(57) ABSTRACT

A method includes executing, by a processor core, a first task; scheduling, by a scheduler, a second task to be executed by the processor core upon completion of executing the first task; responsive to scheduling the second task, providing, by the scheduler, a prewarming message to a memory management unit (MMU) coupled to the processor core; and responsive to receiving the prewarming message, fetching, by the MMU, a page table specified by a page table base of the prewarming message.

20 Claims, 5 Drawing Sheets

TRANSLATION LOOKASIDE BUFFER PREWARMING

CROSS-REFERENCE TO RELATED APPLICATIONS

The present application claims priority to U.S. Provisional Patent Application No. 62/914,061, which was filed Oct. 11, 2019, is titled "Memory Management Unit For A Processor," and is hereby incorporated herein by reference in its entirety.

BACKGROUND

Managing interactions between multiple software applications or program tasks and physical memory involves address translation (e.g., between a virtual address and a physical address or between a first physical address and a second physical address). Software applications or program task modules are generally compiled with reference to a virtual address space. When an application or task interacts with physical memory, address translation is performed to translate a virtual address into a physical address in the physical memory. Address translation consumes processing and/or memory resources. A cache of translated addresses, referred to as a translation lookaside buffer (TLB), improves address translation performance.

SUMMARY

In accordance with at least one example of the disclosure, a method includes executing, by a processor core, a first task; scheduling, by a scheduler, a second task to be executed by the processor core upon completion of executing the first task; responsive to scheduling the second task, providing, by the scheduler, a prewarming message to a memory management unit (MMU) coupled to the processor core; and responsive to receiving the prewarming message, fetching, by the MMU, a page table specified by a page table base of the prewarming message.

In accordance with another example of the disclosure, a system includes a first processor core configured to execute a first task and a scheduler. The scheduler is configured to schedule a second task to be executed by the processor core upon completion of the first task and provide, responsive to scheduling the second task, a prewarming message to a memory management unit (MMU) coupled to the processor core. The MMU is configured to fetch, responsive to receiving the prewarming message, a page table specified by a page table base of the prewarming message.

In accordance with yet another example of the disclosure, a non-transitory, computer-readable medium containing instructions that, when executed by a processor, cause the processer to schedule a next task to be executed by a processor core executing a current task and, responsive to scheduling the next task, provide a prewarming message to a memory management unit (MMU) coupled to the processor core. The MMU is configured to fetch, responsive to receiving the prewarming message, a page table specified by a page table base of the prewarming message.

BRIEF DESCRIPTION OF THE DRAWINGS

For a detailed description of various examples, reference will now be made to the accompanying drawings in which.

DETAILED DESCRIPTION

Figure 1:
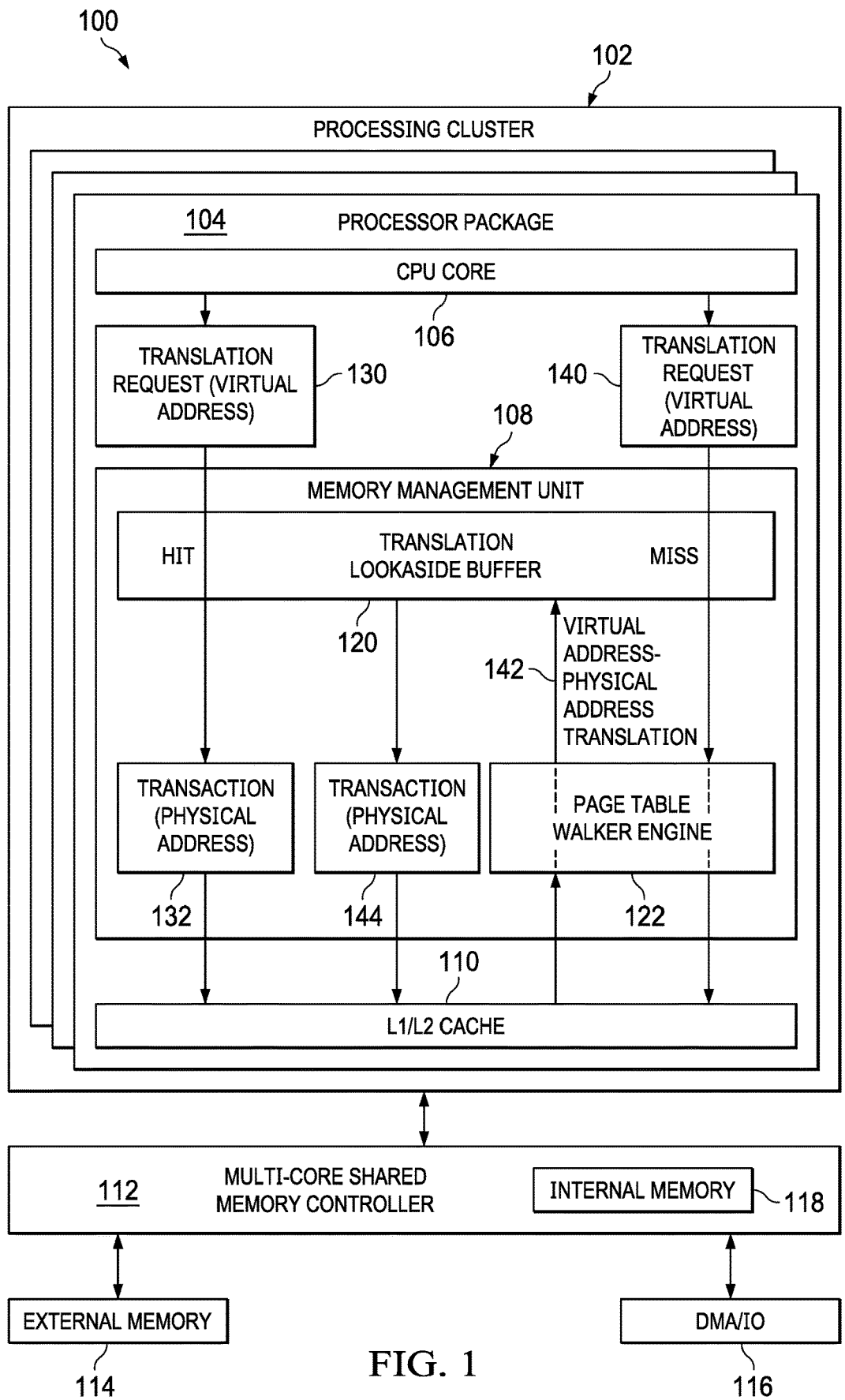
FIG. 1 is a block diagram of a multi-core processing system in accordance with various examples.

FIG. 1 is a functional block diagram of a multi-core processing system 100, in accordance with examples of this description. In one example, the system 100 is a multi-core system-on-chip (SoC) that includes a processing cluster 102 having one or more processor packages 104. In some examples, the one or more processor packages 104 include one or more types of processors, such as a central processor unit (CPU), graphics processor unit (GPU), digital signal processor (DSP), etc. In one example, a processing cluster 102 includes a set of processor packages split between DSP, CPU, and GPU processor packages. In some examples, each processor package 104 includes one or more processing cores 106. As used herein, the term "core" refers to a processing module that is configured to contain an instruction processor, such as a DSP or other type of microprocessor. Each processor package 104 also contains a memory management unit (MMU) 108 and one or more caches 110. In some example, the caches 110 include one or more level one (L1) caches and one or more level two (L2) caches. For example, a processor package 104 includes four cores 106, each core including an L1 data cache and L1 instruction cache, along with a L2 cache shared by the four cores 106.

The multi-core processing system 100 also includes a multi-core shared memory controller (MSMC) 112, which couples the processing cluster 102 to one or more external memories 114 and direct memory access/input/output (DMA/IO) clients 116. The MSMC 112 also includes an on-chip internal memory 118 that is directly managed by the MSMC 112. In certain examples, the MSMC 1112 manages traffic between multiple processor cores 106, other mastering peripherals or DMA clients 116 and allows processor packages 104 to dynamically share the internal and external memories for both program instructions and data. The MSMC internal memory 118 offers additional flexibility (e.g., to software programmers) because portions of the internal memory 118 are configured as a level 3 (L3) cache.

The MMU 108 is configured to perform address translation between a virtual address and a physical address, including intermediate physical addresses for multi-stage address translation. In some examples, the MMU 108 is also configured to perform address translation between a first physical address and a second physical address (e.g., as part of a multi-stage address translation). In particular, the MMU 108 helps to translate virtual memory addresses to physical memory addresses for the various memories of the system 100. The MMU 108 contains a translation lookaside buffer (TLB) 120 that is configured to store translations between addresses (e.g., between a virtual address and a physical address or between a first physical address and a second physical address). Although not shown for simplicity, in other examples the MMU 108 additionally includes a micro-TLB (uTLB), such as a fully associative uTLB, which, along with the TLB 120, serve as caches for page translations. In some examples, the TLB 120 also stores address pointers of page tables. In addition to address translations stored (e.g., cached) in the TLB 120, the MMU 108 includes one or more page table walker engines 122 that are configured to access or "walk" one or more page tables to translate a virtual address to a physical address, or to translate an intermediate physical address to a physical address. The function of the page table walker engine 122 is described further below.

The processor core 106 generates a transaction directed to a virtual address that corresponds to a physical address in memory (e.g., external memory 114). Examples of such transactions generated by the processor core 106 include reads from the memory 114 and writes to the memory 114; however, other types of transactions requiring address translation (e.g., virtual-to-physical address translation and/or physical-to-physical address translation) are also within the scope of this description. For ease of reference, any transaction that entails address translation is referred to as an address translation request (or "translation request"), and it is further assumed for simplicity that translation requests specify a virtual address to be translated to a physical address. The processor core 106 thus provides a translation request to the MMU 108.

Responsive to receiving a translation request from the processor core 106, the MMU 108 first translates the virtual address specified by the translation request to a physical address. A first example translation request 130 is provided by the processor core 106 to the MMU 108. The MMU 108 first determines whether the first translation request 130 hits the TLB 120 (e.g., the TLB 120 already contains the address translation for the virtual address specified by the first translation request 130). In this example, the first translation request 130 does hit the TLB 120, and thus the MMU 108 forwards a transaction 132 that includes the translated physical address to a lower level memory (e.g., the caches 110) for further processing.

A second example translation request 140 is provided by the processor core 106 to the MMU 108. The MMU 108 again determines whether the second translation request 140 hits the TLB 120. In this example, the second translation request 140 misses (e.g., does not hit) the TLB 120. Responsive to the second translation request 140 missing the TLB 120, the MMU 108 provides the second translation request 140 to its page table walker engine 122, which accesses (e.g., "walks") one or more page tables in a lower level memory (e.g., the caches 110, 118, or external memory 114) to translate the virtual address specified by the second translation request 140 to a physical address. The process of walking page tables is described in further detail below. Once the page table walker engine 122 translates the virtual address to a physical address, the address translation is stored in the TLB 120 (depicted as arrow 142), and the MMU 108 forwards a transaction 144 that includes the translated physical address to a lower level memory for further processing.

A third possibility exists, in which the translation request from the processor core 106 only partially hits the TLB 120. In such a situation, which will be described further below, the page table walker engine 122 still walks one or more page tables in the lower level memory to translate the virtual address specified by the translation request to a physical address. However, because the translation request partially hit the TLB 120, a reduced number of page tables are walked in order to perform the address translation relative to a translation request that completely misses the TLB 120.

Figure 2:
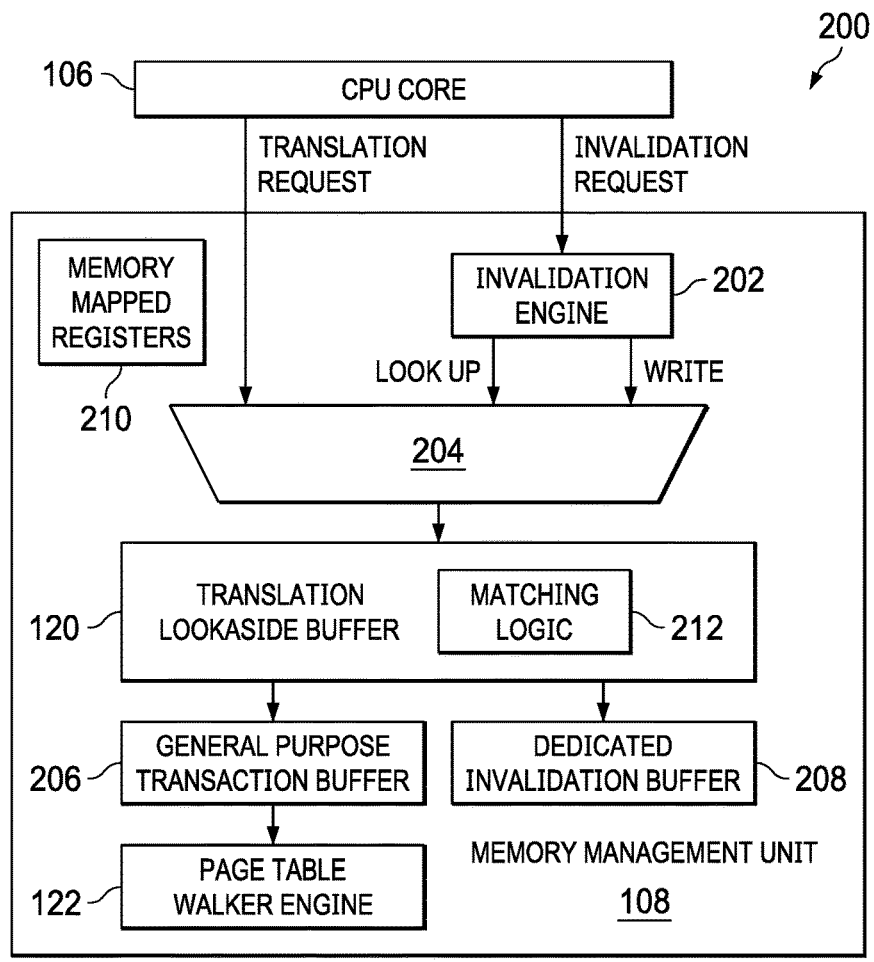
FIG. 2 is a block diagram showing a memory management unit in greater detail and in accordance with various examples.

FIG. 2 is a block diagram of a system 200 that includes a processor core 106 and MMU 108, which itself includes the TLB 120 and page table walker engine 122, as described above. In the example of FIG. 2, the MMU 108 is shown in further detail and includes an invalidation engine 202, a transaction multiplexer (mux) 204, a general purpose transaction buffer 206, a dedicated invalidation buffer 208, and one or more memory mapped registers (MMRs) 210 that are used to control and/or configure various functionality of the MMU 108. In some examples, the TLB 120 includes multiple pipeline stages (shown as matching logic 212) that facilitate the TLB 120 receiving a translation request and determining whether the virtual address specified by the translation request hits the TLB 120, partially hits the TLB 120, or misses the TLB 120.

As described above, the processor core 106 is configured to provide various translation requests to the MMU 108, which are provided to the transaction mux 204 as shown. In some examples, the processor core 106 is configured to provide address invalidation requests (or "invalidation requests") to the MMU 108 in addition to the translation requests. Invalidation requests are requests to invalidate one or more entries in the TLB 120. In some examples, invalidation requests are for a single entry (e.g., associated with a particular virtual address) in the TLB 120, while in other examples, invalidation requests are for multiple entries (e.g., associated with a particular application ID) in the TLB 120. The invalidation requests are provided to the invalidation engine 202 of the MMU 108, which in turn forwards such invalidation requests to be looked up (LU) in the TLB 120 to the transaction mux 204 as shown. Regardless of the type of request, the transaction mux 204 is configured to pass both translation requests and invalidation requests to the TLB 120. In some examples, control logic provides control signals to the transaction mux 204 to select one of the inputs to the transaction mux 204 to be provided as the output of the transaction mux 204. In an example, address translation requests are prioritized over address invalidation requests until there are no more available spots in the general purpose transaction buffer 206 for such address translation requests.

Responsive to receiving a request (e.g., either a translation request or an invalidation request), the matching logic 212 (e.g., implemented by pipeline stages of the TLB 120) determines whether the request hits the TLB 120, partially hits the TLB 120, or misses the TLB 120.

Depending on the type of request, various resulting transactions are produced by the matching logic 212. For example, a translation request can hit the TLB 120, partially hit the TLB 120, or miss the TLB 120. An invalidation request can either hit the TLB 120 or miss the TLB 120, because an invalidation request that only partially hits an entry in the TLB 120 should not result in invalidating that entry in some examples. In other examples, an invalidation request can also partially hit the TLB 120. For example, a partial hit on the TLB 120 exists when a request hits on one or more pointers to page table(s), but does not hit on at least the final page table. A hit on the TLB 120 exists when a request hits on both the one or more pointers to page table(s) as well as the final page table itself. In some examples, an invalidation request includes a "leaf level" bit or field that specifies to the MMU 108 whether to invalidate only the final page table (e.g., partial hits on the TLB 120 do not result in invalidating an entry) or to invalidate pointers to page table(s) as well (e.g., a partial hit on the TLB 120 results in invalidating an entry).

Responsive to a translation request that hits the TLB 120, the MMU 108 provides an address transaction specifying a physical address to the general purpose transaction buffer 206. In this example, the general purpose transaction buffer 206 is a first-in, first-out (FIFO) buffer. Once the address transaction specifying the physical address has passed through the general purpose transaction buffer 206, the MMU 108 forwards that address transaction to a lower level memory to be processed.

Responsive to a translation request that partially hits the TLB 120 or misses the TLB 120, the MMU 108 provides an address transaction that entails further address translation to the general purpose transaction buffer 206. For example, if the translation request misses the TLB 120, the address transaction provided to the general purpose transaction buffer 206 entails complete address translation (e.g., by the page table walker engine 122). In another example, if the translation request partially hits the TLB 120, the address transaction provided to the general purpose transaction buffer 206 entails additional, partial address translation (e.g., by the page table walker engine 122). Regardless of whether the address transaction entails partial or full address translation, once the address transaction that entails additional translation has passed through the general purpose transaction buffer 206, the MMU 108 forwards that address transaction to the page table walker engine 122, which in turn performs the address translation.

Generally, performing address translation is more time consuming (e.g., consumes more cycles) than simply processing a transaction such as a read or a write at a lower level memory. Thus, in examples where multiple translation requests miss the TLB 120 or only partially hit the TLB 120 (e.g., entails some additional address translation be performed by the page table walker engine 122), the general purpose transaction buffer 206 can back up and become full. The processor core 106 is aware of whether the general purpose transaction buffer 206 is full and, responsive to the general purpose transaction buffer 206 being full, the processor core 106 temporarily stalls from sending additional translation requests to the MMU 108 until space becomes available in the general purpose transaction buffer Responsive to an invalidation look-up request that hits the TLB 120, the MMU 108 provides a transaction specifying that an invalidation match occurred in the TLB 120, referred to as an invalidation match transaction for simplicity. Responsive to the general purpose transaction buffer 206 having space available (e.g., not being full), the MMU 108 is configured to provide the invalidation match transaction to the general purpose transaction buffer 206. However, responsive to the general purpose transaction buffer 206 being full, the MMU 108 is configured to provide the invalidation match transaction to the dedicated invalidation buffer 208. In this example, the dedicated invalidation buffer 208 is also a FIFO buffer. As a result, even in the situation where the general purpose transaction buffer 206 is full (e.g., due to address translation requests missing or only partially hitting the TLB 120, and thus backing up in the general purpose transaction buffer 206), the processor core 106 is able to continue sending invalidation requests to the MMU 108 because the invalidation requests are able to be routed to the dedicated invalidation buffer 208, and thus are not stalled behind other translation requests.

Regardless of whether the invalidation match transaction is stored in the general purpose transaction buffer 206 or the dedicated invalidation buffer 208, once the invalidation match transaction passes through one of the buffers 206, 208, the invalidation match transaction is provided to the invalidation engine 202, which is in turn configured to provide an invalidation write transaction to the TLB 120 to invalidate the matched entry or entries. In an example, invalidation look-up requests that miss the TLB 120 are discarded (e.g., not provided to either the general purpose transaction buffer 206 or the dedicated invalidation buffer 208).

Figure 3A:
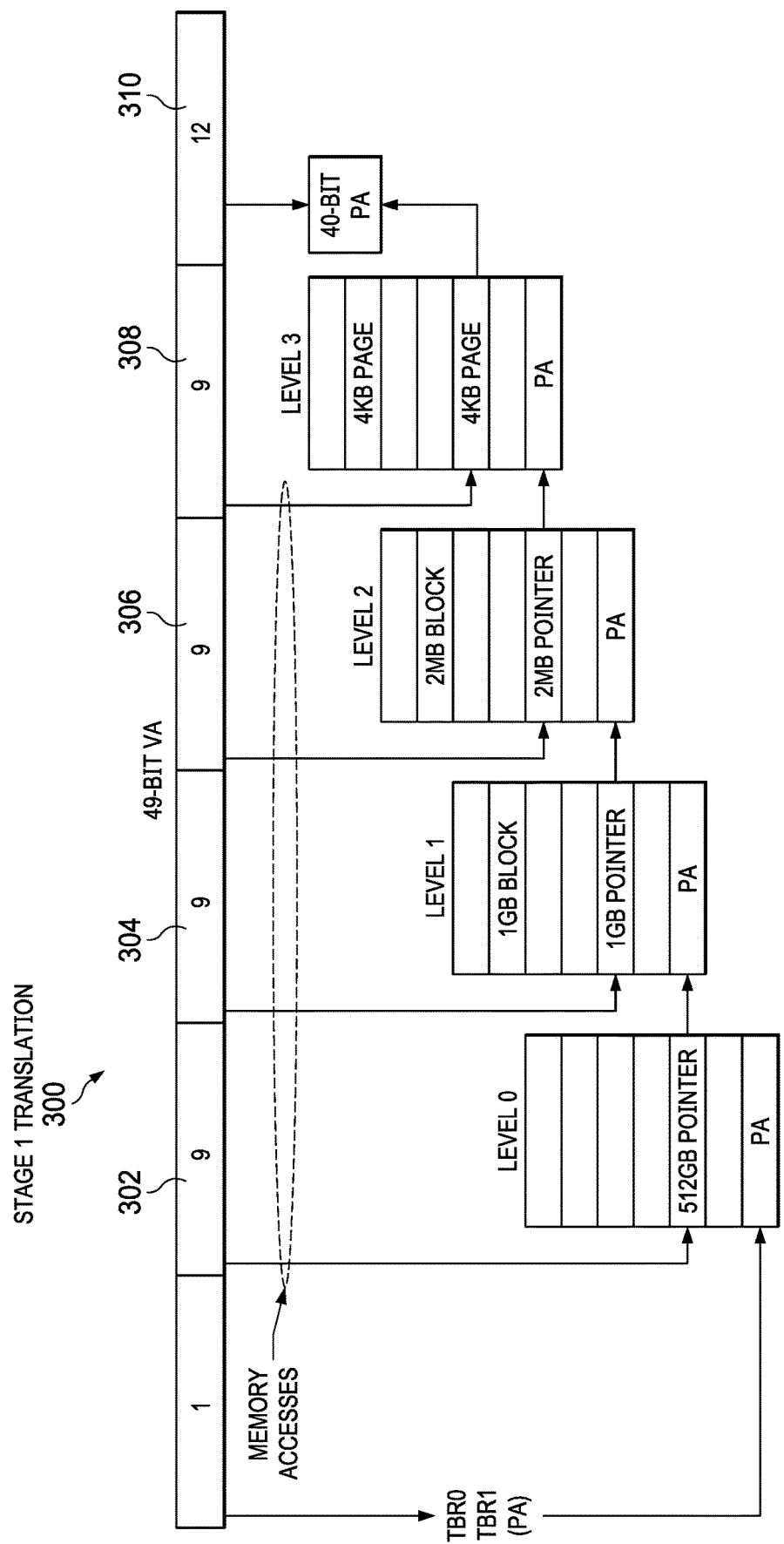
FIGS. 3a and 3b are examples of one- and two-stage address translation in accordance with various examples.

FIG. 3a is an example translation 300 for translating a 49-bit virtual address (VA) to a physical address (PA) in accordance with examples of this description. The example translation 300 is representative of the functionality performed by the page table walker engine 122 responsive to receiving a transaction that entails full or partial address translation.

In this example, the most significant bit of the 49-bit VA specifies one of two table base registers (e.g., TBR0 or TBR1, implemented in the MMRs 210). The table base registers each contain a physical address that is a base address of a first page table (e.g., Level 0). In this example, each page table includes 512 entries, and thus an offset into a page table is specified by nine bits. A first group of nine bits 302 provides the offset from the base address specified by the selected table base register into the Level 0 page table to identify an entry in the Level 0 page table. The identified entry in the Level 0 page table contains a physical address that serves as a base address of a second page table (e.g., Level 1).

A second group of nine bits 304 provides the offset from the base address specified by entry in the Level 0 page table into the Level 1 page table to identify an entry in the Level 1 page table. The identified entry in the Level 1 page table contains a physical address that serves as a base address of a third page table (e.g., Level 2).

A third group of nine bits 306 provides the offset from the base address specified by entry in the Level 1 page table into the Level 2 page table to identify an entry in the Level 2 page table. The identified entry in the Level 2 page table contains a physical address that serves as a base address of a fourth, final page table (e.g., Level 3).

A fourth group of nine bits 308 provides the offset from the base address specified by entry in the Level 2 page table into the Level 3 page table to identify an entry in the Level 3 page table. The identified entry in the Level 3 page table contains a physical address that serves as a base address of an exemplary 4 KB page of memory. The final 12 bits 310 of the VA provide the offset into the identified 4 KB page of memory, the address of which is the PA to which the VA is translated.

Figure 3B:
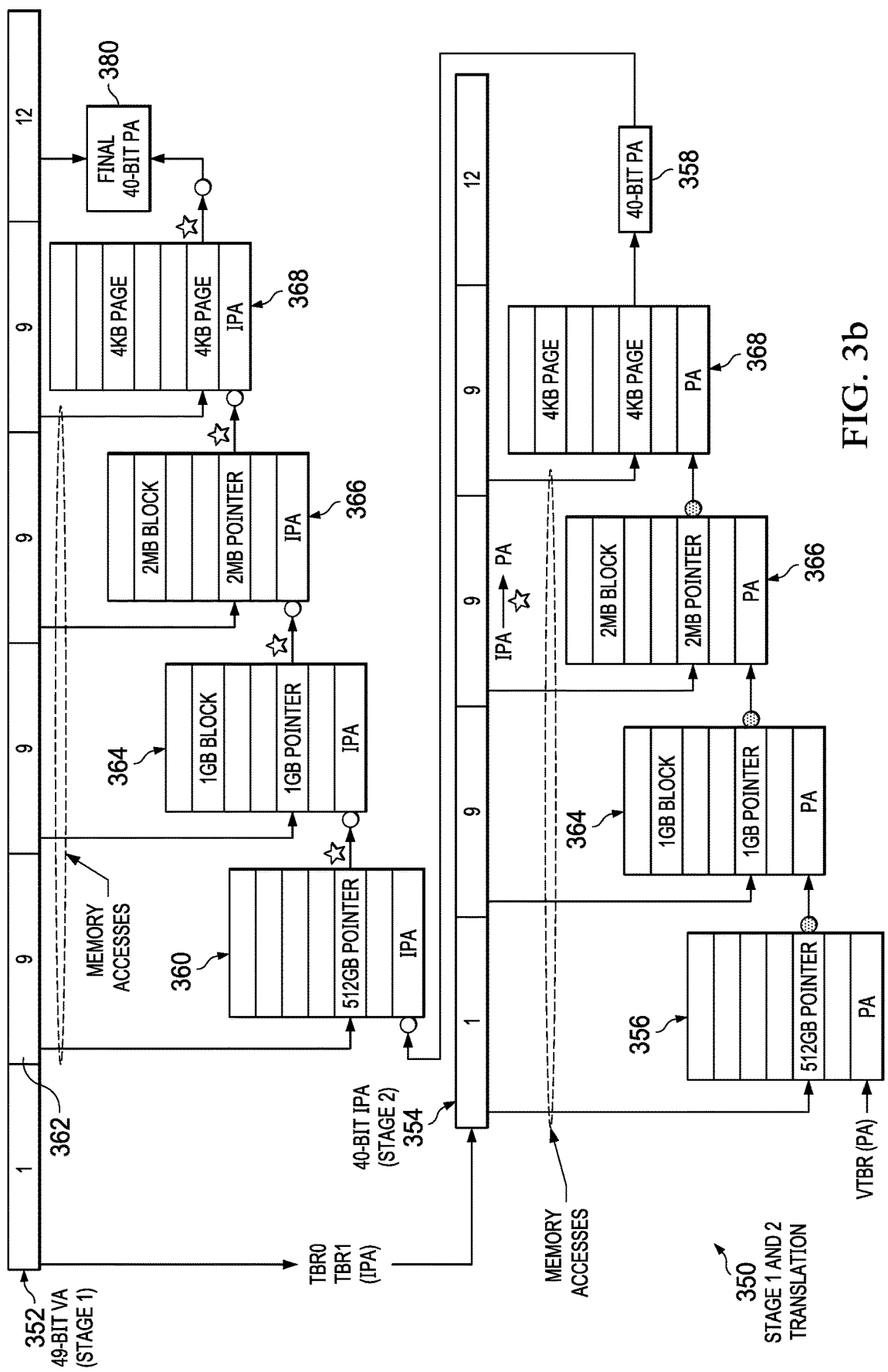

FIG. 3b is an example two-stage translation 350 for translating a 49-bit virtual address (VA) to a physical address (PA), including translating one or more intermediate physical addresses (IPA) in accordance with examples of this description. In an example, a value of one of the MMRs 210 of the MMU 108 is determinative of whether the MMU 108 is configured to perform one-stage translation as shown in FIG. 3a or two-stage translation as shown in FIG. 3b. The example translation 350 is representative of the functionality performed by the page table walker engine 122 responsive to receiving a transaction that entails full or partial address translation.

The two-stage translation 350 differs from the one-stage translation 300 described above in that the physical address at each identified entry is treated as an intermediate physical address that is itself translated to a physical address. For example, the most significant bit of the 49-bit VA 352 again specifies one of two table base registers (e.g., TBR0 or TBR1, implemented in the MMRs 210). However, the physical address contained by the selected table base register is treated as IPA 354, which is translated to a physical address. In this example, a virtual table base register (e.g., VTBR, implemented in the MMRs 210) contains a physical address that is a base address of a first page table 356. The remainder of the IPA 354 is translated as described above with respect to the 49-bit VA of FIG. 3*a*.

The resulting 40-bit PA 358 is a base address for a first page table 360 for the translation of the 49-bit VA 352 to the final 40-bit PA 380, while a first group of nine bits 362 of the VA 352 provides the offset from the base address specified by the PA 358 into the first page table 360 to identify an entry in the first page table 360. However, unlike the one-stage translation 300, the entry in the first page table 360 is treated as an IPA (e.g., replacing previous IPA 354) that is itself translated to a new PA 358, which is then used as a base address for a second page table 364. That is, the entry in the first page table 360 is not used directly as a base address for the second page table 364, but rather is first translated as an IPA 354 to a PA 358 and that resulting PA 358 is then used as the base address for the second page table 364. This process continues in a like manner for a third page table 366 and a fourth page table 368 before arriving at the final 40-bit PA 380. For example, the address contained in the final Level 3 page table (e.g., page table 368) is also an IPA that is translated in order to arrive at the final 40-bit PA 380.

Thus, while performing a one-stage translation 300 may entail multiple memory accesses, performing a two-stage translation 350 may entail still more memory accesses, which can reduce performance when many such translations are performed. Additionally, FIGS. 3*a* and 3*b* are described with respect to performing a full address translation. However, as described above, in some instances a translation request partially hits the TLB 120, for example where a certain number of most significant bits of a virtual address of the translation request match an entry in the TLB 120. In such examples, the page table walker engine 122 does not necessarily perform each level of the address translation and instead only performs part of the address translation. For example, referring to FIG. 3*a*, if the most significant 19 bits of a virtual address of a translation request match an entry in the TLB 120, the page table walker engine 122 begins with the base address of the Level 2 page table and only needs to perform address translation using the third and fourth groups of nine bits 306, 308. In other examples, similar partial address translations are performed with regard to a two-stage translation 350.

In accordance with examples of this description, when a processor core 106 switches context to a different application or operating system (OS) (generally referred to as "tasks"), the TLB 120 is not necessarily populated with entries to facilitate or expedite address translation for the application or OS being switched to. As explained above, the page table walker engine 122 performing such address translations to populate the TLB 120 may take a certain amount of time. This overhead effectively stalls the processor core 106 (and/or the application or OS being switched to) until the address translation(s) are performed and cached in the TLB 120.

Figure 4:
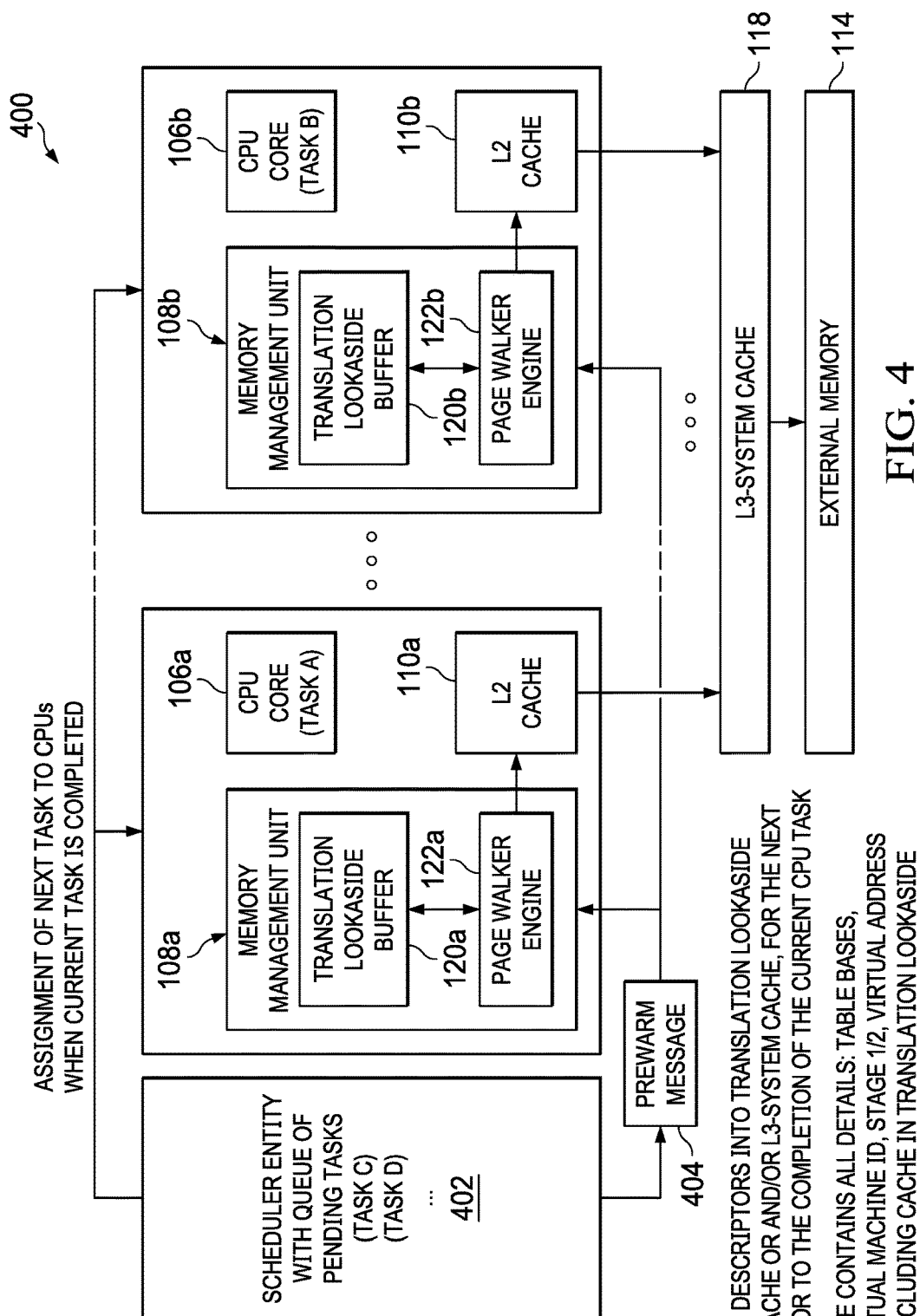
FIG. 4 is a block diagram showing a multi-core processing system including a scheduler to provide a TLB prewarming message in accordance with various examples.

FIG. 4 is a block diagram showing a multi-core processing system 400 including a scheduler entity 402 to provide a TLB prewarming message 404 in accordance with examples of this description. The scheduler entity 402 refers to a processor core and a scheduling application executing thereon, where the scheduler entity 402 is separate from the processor cores 106*a*, 106*b* that execute other tasks (e.g., task A and task B, respectively). In some examples, a non-transitory, computer-readable medium contains instructions (e.g., the scheduling application) that, when executed by a processor, cause the processer to provide the functionality of the scheduler entity 402 described below. The scheduler entity 402 is responsible for scheduling upcoming tasks to be performed by the processor cores 106*a*, 106*b*. For example, the scheduler entity 402 is configured to determine that a processor core 106 is completing a first (e.g., current) task within a predetermined amount of time (e.g., a number of clock cycles). Responsive to such determination, the scheduler entity 402 is configured to schedule a second task to be executed by the processor core 106 upon completion of the first task. In an example in which the scheduler entity 402 schedules tasks for multiple processor cores 106*a*, 106*b*, the scheduler entity 402 is configured to determine which processor core 106*a*, 106*b* will complete its current task first, and schedules an upcoming task for the one of the processor cores 106*a*, 106*b* that the scheduler entity 402 determines will first complete its current task.

In the specific example of FIG. 4, the processor core 106*a* is currently executing task A while the processor core 106*b* is currently executing task B. If it is determined that the processor core 106*a* will complete task A before the processor core 106*b* completes task B, the scheduler entity 402 schedules the next task, task C, for execution by the processor core 106*a*. However, if it is determined that the processor core 106*b* will complete task B before the processor core 106*a* completes task A, the scheduler entity 402 schedules the next task, task C, for execution by the processor core 106*b*.

Responsive to scheduling the next task (e.g., task C) for one of the processor cores 106*a*, 106*b*, the scheduler entity 402 is configured to provide a prewarming message 404 to the respective MMU 108*a*, 108*b* coupled to that processor core 106*a*, 106*b*. In accordance with examples of this description, the prewarming message 404 includes details sufficient to allow the respective page table walker engine 122*a*, 122*b* of the MMU 108*a*, 108*b* to begin performing address translations for the scheduled task C. For example, the prewarming message 404 includes the information for the page table walker engine 122*a*, 122*b* to perform a complete address translation table walk. In some examples, the prewarming message 404 includes information such as a table base, an application ID (e.g., associated with the scheduled task C), a virtual machine ID, an indication of whether one- or two-stage translation is to be used, a virtual address to be translated, and various walk attributes.

In an example, the walk attributes include whether to cache the result of the address translation in the respective TLB 120*a*, 120*b*, or whether to cache the result of the address translation in a lower level memory such as the respective L2 cache 110*a*, 110*b* or the L3 cache 118. In one example, the application ID for the scheduled task C is the same as the application ID for the currently executing task, and thus the scheduler entity 402 determines that the result of the address translation should not be cached in the TLB 120*a*, 120*b* because this could result in an inappropriate hit in the TLB 120*a*, 120*b* for the currently executing task. Continuing this example, the scheduler entity 402 instead determines that the result of the address translation should be cached in a lower level memory and indicates the same in the walk attributes of the prewarming message 404.

Thus, at least portions of the prewarming message 404 correspond to information that would normally be stored in the MMRs 210 of the respective MMU 108*a*, 108*b* (e.g., the table base and whether translation is one- or two-stage). However, in accordance with examples of this description, the prewarming message 404 directly provides this information to the respective MMU 108*a*, 108*b* without overwriting those MMRs 210 so that address translations can still be performed for the currently executing task.

Responsive to receiving the prewarming message 404, the MMU 108 is at least configured to fetch a page table specified by a page table base of the prewarming message 404. In one example, depending on the walk attributes of the prewarming message 404, fetching includes merely caching the page table in one of the lower level memories 110, 118. In another example, again depending on the walk attributes of the prewarming message 404, fetching the page table includes determining (e.g., using the page table walker engine 122) the address translation of the virtual address specified by the prewarming message 404 and storing the address translation in the TLB 120.

As a result, the MMU 108 is able to utilize the prewarming message 404 prior to beginning to execute the scheduled task (e.g., task C) to cause its page table walker engine 122 to start fetching page table entries into closer memories (e.g., the L2 cache 110 or the L3 cache 118 instead of the external memory 114). In this example, the caches 110, 118 are warmed for faster subsequent page table walks when the next task C begins to execute. In another example, when possible (e.g., application ID of scheduled task does not overlap with application ID of current task), the MMU 108 is able to utilize the prewarming message 404 prior to beginning to execute the scheduled task (e.g., task C) to cause its page table walker engine 122 to actually perform the address translation and load the resulting address translations into the TLB 120. In this example, the TLB 120 is already preloaded with certain address translations to be used when the next task C begins to execute, further reducing address translation overhead.

In another example, a current (e.g., first) task being executed by one of the processor cores 106 using a first address translation in the TLB 120. In some examples, rather than determining to schedule a next task to be executed by the processor core 106, the first task entails further address translations beyond those being used currently by the first task (e.g., first address translations that are stored in the TLB 120). A subsequent "phase" of the first task uses other translations (e.g., second address translations) than the first address translations stored in the TLB 120. Thus, the scheduler entity 402 is configured to determine whether a time period in which the first task will switch to using the second address translations is less than a threshold value. Responsive to determining that the time period is less than the threshold value, the scheduler entity 402 is configured to provide a second prewarming message 404 to the MMU 108 coupled to the processor core 106. Similar to as described above, the second prewarming message 404 includes details sufficient to allow the page table walker engine 122 of the MMU 108 to begin performing the second address translations for the subsequent phase of the first task.

Responsive to receiving the second prewarming message 404, the MMU 108 is at least configured to fetch a second page table specified by a second page table base of the second prewarming message 404. In one example, depending on the walk attributes of the second prewarming message 404, fetching includes merely caching the second page table in one of the lower level memories 110, 118. In another example, again depending on the walk attributes of the second prewarming message 404, fetching the second page table includes determining (e.g., using the page table walker engine 122) the address translation of the virtual address specified by the second prewarming message 404 and storing the address translation in the TLB 120.

As a result, the MMU 108 is able to utilize the second prewarming message 404 prior to beginning to execute the subsequent phase of the current task to cause its page table walker engine 122 to start fetching page table entries into closer memories (e.g., the L2 cache 110 or the L3 cache 118 instead of the external memory 114). In this example, the caches 110, 118 are warmed for faster subsequent page table walks when the subsequent phase of the current task begins to execute. In another example, when possible (e.g., application ID of the subsequent phase does not overlap with application ID of current phase of the task), the MMU 108 is able to utilize the prewarming message 404 prior to beginning to execute the subsequent phase of the current task to cause its page table walker engine 122 to actually perform the address translation and load the resulting address translations into the TLB 120. In this example, the TLB 120 is already preloaded with certain address translations to be used when the subsequent phase of the current task begins to execute, further reducing address translation overhead.

Figure 5:
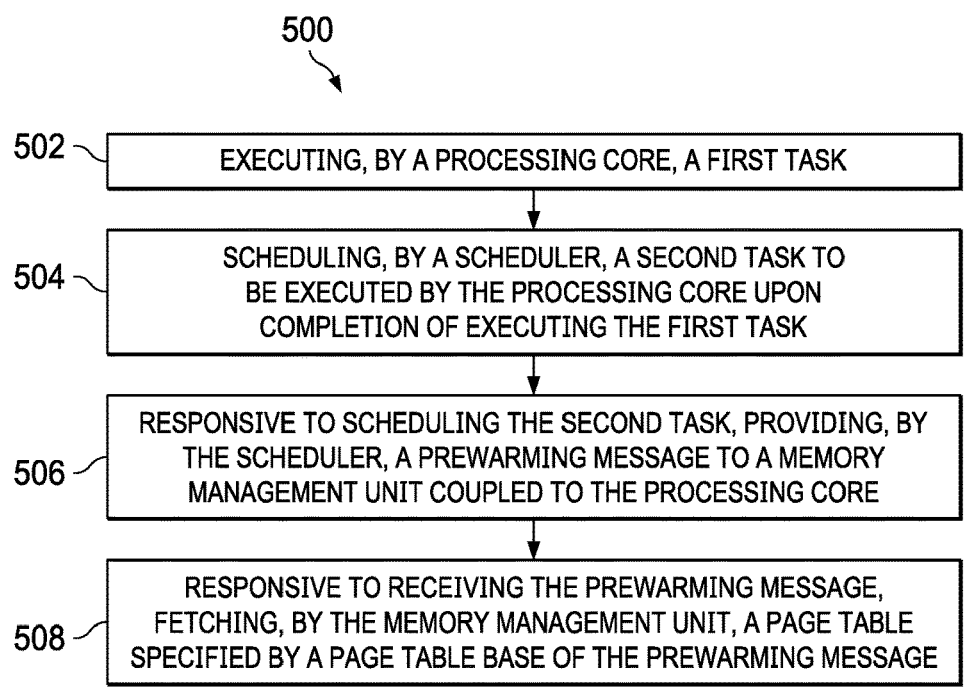
FIG. 5 is a flow chart of a method of TLB prewarming in accordance with various examples.

FIG. 5 is a flow chart of a method 500 of prewarming the TLB 120 in accordance with various examples. The method 500 begins in block 502 with executing a first task. As described above, the first task is executed by a processor core 106 (or by one of the processor cores 106a, 106b). The method 500 continues to block 504 with scheduling a second task to be executed by the processor core 106 upon completion of its executing the first task. As described above, a scheduler entity 402 (e.g., a scheduling application executed on a second processor core separate from the processor core 106) is responsible for scheduling upcoming tasks to be performed by the processor core(s) 106. For example, the scheduler entity 402 is configured to determine that a processor core 106 is completing a first (e.g., current) task within a predetermined amount of time (e.g., a number of clock cycles). In an example in which the scheduler entity 402 schedules tasks for multiple processor cores 106a, 106b, the method 500 includes determining which processor core 106a, 106b will complete its current task first, and scheduling an upcoming task for the one of the processor cores 106a, 106b that the scheduler entity 402 determines will first complete its current task.

The method 500 then continues to block 506, in which the scheduler entity 402 (e.g., the second processor core executing a scheduling application), responsive to scheduling the second task, provides a prewarming message 404 to the MMU 108 coupled to the processor core 106. As described above, the prewarming message 404 includes details sufficient to allow the page table walker engine 122 of the MMU 108 to begin performing address translations for the scheduled second task.

Finally, the method continues to block 508, in which the MMU 108, responsive to receiving the prewarming message 404, fetches a page table specified by a page table base of the prewarming message 404. For example, depending on the walk attributes of the prewarming message 404, fetching includes merely caching the page table in one of the lower level memories 110, 118. In another example, again depending on the walk attributes of the prewarming message 404, fetching the page table includes determining (e.g., using the page table walker engine 122) the address translation of the virtual address specified by the prewarming message 404 and storing the address translation in the TLB 120.

In the foregoing discussion and in the claims, the terms "including" and "comprising" are used in an open-ended fashion, and thus mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is illustrative of the principles and various embodiments of the present disclosure. Numerous variations and modifications will become apparent to those skilled in the art once the above disclosure is fully appreciated. The following claims should be interpreted to embrace all such variations and modifications.

What is claimed is:

1. A method, comprising:
   executing, by a processor core, a first task; and
   prior to completion of the executing of the first task:
   scheduling, by a scheduler, a second task to be executed by the processor core upon the completion of the executing of the first task;
   responsive to the scheduling of the second task, providing, by the scheduler, a prewarming message to a memory management unit (MMU) coupled to the processor core; and
   responsive to receiving the prewarming message, fetching, by the MMU, a page table specified by a page table base of the prewarming message.

2. The method of claim 1, wherein the specified page table is stored in a main memory coupled to the MMU and the fetching further comprises caching the page table in a cache between the main memory and the processor core.

3. The method of claim 2, wherein:
   the cache is a first cache;
   a second cache is arranged between the main memory and the first cache;
   the prewarming message specifies whether to cache the page table in the first cache or in the second cache; and
   the fetching further comprises caching the page table in the first cache responsive to the prewarming message specifying to cache the page table in the first cache, or caching the page table in the second cache responsive to the prewarming message specifying to cache the page table in the second cache.

4. The method of claim 1, wherein:
   the prewarming message specifies a virtual address and whether to cache an address translation of the virtual address in a translation lookaside buffer (TLB) of the MMU; and
   the fetching further comprises, responsive to the prewarming message specifying to cache the address translation in the TLB, determining the address translation of the virtual address to a physical address using the page table and storing the address translation in the TLB.

5. The method of claim 1, wherein the prewarming message is a first prewarming message, the page table is a first page table, and the page table base is a first page table base, the method further comprising, while executing the first task using a first address translation:
   determining, by the scheduler, that a time period in which the first task will switch to using a second address translation is less than a threshold value; and
   responsive to the determination, providing, by the scheduler a second prewarming message to the MMU; and
   responsive to receiving the second prewarming message, fetching, by the MMU, a second page table specified by a second page table base of the second prewarming message.

6. The method of claim 1, wherein the MMU receives the prewarming message directly from the scheduler.

7. The method of claim 1, wherein the processor core is a first processor core, the method further comprising executing, by a second processor core, a third task, wherein the scheduling of the second task to be executed by the first processor core upon completion of executing the first task is responsive to determining that the first processor core will complete executing the first task prior to the second processor core completing executing the third task.

8. A system, comprising:
   a processor core configured to execute a first task;
   a scheduler coupled to the processor core; and
   a memory management unit (MMU) coupled to the processor core and the scheduler, wherein:
   the scheduler is configured to, prior to completion of the first task:
      schedule a second task to be executed by the processor core upon the completion of the first task; and
      provide, responsive to scheduling the second task, a prewarming message to the MMU; and
   the MMU is configured to, prior to the completion of the first task, fetch, responsive to receiving the prewarming message, a page table specified by a page table base of the prewarming message.

9. The system of claim 8, further comprising a main memory coupled to the MMU and a cache between the main memory and the processor core, wherein the specified page table is stored in the main memory, and wherein the MMU is further configured to cache the page table in the cache.

10. The system of claim 9, wherein:
    the cache is a first cache;
    a second cache is arranged between the main memory and the first cache;
    the prewarming message specifies whether to cache the page table in the first cache or in the second cache; and
    the MMU is configured to cache the page table in the first cache responsive to the prewarming message specifying to cache the page table in the first cache, or cache the page table in the second cache responsive to the prewarming message specifying to cache the page table in the second cache.

11. The system of claim 8, wherein:
the prewarming message specifies a virtual address and whether to cache an address translation of the virtual address in a translation lookaside buffer (TLB) of the MMU; and
the MMU is further configured to, responsive to the prewarming message specifying to cache the address translation in the TLB, determine the address translation of the virtual address to a physical address using the page table and store the address translation in the TLB.

12. The system of claim 8, wherein:
the prewarming message is a first prewarming message, the page table is a first page table, and the page table base is a first page table base;
the scheduler is further configured to:
determine that a time period in which the first task will switch from using a first address translation to using a second address translation is less than a threshold value; and
provide a second prewarming message to the MMU; and
the MMU is further configured to, responsive to receiving the second prewarming message, fetch a second page table specified by a second page table base of the second prewarming message.

13. The system of claim 8, wherein the MMU receives the prewarming message directly from the scheduler.

14. The system of claim 8, wherein the processor core is a first processor core, the system further comprising a second processor core configured to execute a third task, wherein the scheduler schedules the second task to be executed by the first processor core upon completion of executing the first task responsive to a determination that the first processor core will complete executing the first task prior to the second processor core completing executing the third task.

15. A non-transitory, computer-readable medium containing instructions that, when executed by a processor, cause the processor to, prior to completion of execution of a current task:
schedule a next task to be executed by a processor core executing the current task;
responsive to scheduling the next task, provide a prewarming message to a memory management unit (MMU) coupled to the processor core; and
fetch, by the MMU, responsive to receiving the prewarming message, a page table specified by a page table base of the prewarming message.

16. The non-transitory, computer-readable medium of claim 15, wherein the MMU is configured to couple to a main memory and to a cache between the main memory and the processor core, wherein the specified page table is stored in the main memory, and wherein the MMU is further configured to cache the page table in the cache.

17. The non-transitory, computer-readable medium of claim 16, wherein:
the cache is a first cache;
the MMU is configured to couple to a second cache arranged between the main memory and the first cache;
the prewarming message specifies whether to cache the page table in the first cache or in the second cache; and
the MMU is configured to cache the page table in the first cache responsive to the prewarming message specifying to cache the page table in the first cache, or cache the page table in the second cache responsive to the prewarming message specifying to cache the page table in the second cache.

18. The non-transitory, computer-readable medium of claim 15, wherein:
the MMU comprises a translation lookaside buffer (TLB);
the prewarming message specifies a virtual address and whether to cache an address translation of the virtual address in the TLB; and
the MMU is further configured to, responsive to the prewarming message specifying to cache the address translation in the TLB, determine the address translation of the virtual address to a physical address using the page table and store the address translation in the TLB.

19. The non-transitory, computer-readable medium of claim 15, wherein:
the prewarming message is a first prewarming message, the page table is a first page table, and the page table base is a first page table base;
the instructions, when executed, further cause the processor to:
determine that a time period in which the current task will switch from using a first address translation to using a second address translation is less than a threshold value; and
provide a second prewarming message to the MMU; and
the MMU is further configured to, responsive to receiving the second prewarming message, fetch a second page table specified by a second page table base of the second prewarming message.

20. The non-transitory, computer-readable medium of claim 15, wherein the instructions, when executed, cause the processor to provide the prewarming message directly to the MMU.

* * * * *